United States Patent
Krishnamurthy et al.

(10) Patent No.: US 6,233,178 B1
(45) Date of Patent: May 15, 2001

(54) METHOD AND APPARATUS FOR PRE-CONDITIONING FLASH MEMORY DEVICES

(75) Inventors: Shyam Krishnamurthy, Los Angeles; Srinjoy Das, Irvine; Michael Le, Huntington Beach; Frank Van Gieson, Irvine; Surya Bhattacharya, Irvine; Umesh Sharma, Newport Beach, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/418,399

(22) Filed: Oct. 14, 1999

(51) Int. Cl.$^7$ ....................................... G11C 7/00
(52) U.S. Cl. ................. 365/185.33; 365/185.24; 365/185.01; 365/185.14; 365/185.18
(58) Field of Search .................. 365/185.33, 185.01, 365/185.24, 185.14, 185.18

(56) References Cited

U.S. PATENT DOCUMENTS

| | | | |
|---|---|---|---|
| 5,265,059 | * 11/1993 | Wells et al. | 365/204 |
| 5,274,599 | * 12/1993 | Ema | 365/218 |
| 5,377,147 | * 12/1994 | Merchant et al. | 365/200 |
| 5,455,800 | * 10/1995 | Wells et al. | 365/218 |
| 5,530,675 | * 6/1996 | Hu | 365/218 |
| 5,657,268 | * 8/1997 | Truong et al. | 365/185.13 |
| 5,684,741 | * 11/1997 | Talreja | 365/185.22 |
| 5,724,289 | * 3/1998 | Watanabe | 365/201 |
| 5,748,528 | * 5/1998 | Campardo et al. | 365/185.13 |
| 5,847,998 | * 12/1998 | Van Buskirk | 365/185.33 |

\* cited by examiner

*Primary Examiner*—Viet Q. Nguyen
(74) *Attorney, Agent, or Firm*—Snell & Wilmer

(57) ABSTRACT

Pre-conditioning method and apparatus for mitigating erase-induced stress within flash memory devices are disclosed. The pre-condition method includes subjecting flash memory cell to a short write process to at least partially discharge the cells. The pre-condition process is applied to an entire sector at one time, and is performed immediately prior to erasing (charging) the cells within the sector.

12 Claims, 5 Drawing Sheets

METHOD AND APPARATUS FOR PRE-CONDITIONING FLASH MEMORY DEVICES

FIELD OF THE INVENTION

The present invention generally relates to flash memory devices. More particularly, the present invention relates to method and apparatus for pre-conditioning the flash memory device to mitigate over-erase induced stresses formed within the device. More specifically this invention relates to flash memory devices where the erase or bulk operation is performed in such a way as to increase the charge stored in the device.

BACKGROUND OF THE INVENTION

A flash memory device is a form of nonvolatile memory that is configured such that a block or sector of memory, typically containing several thousand bits, can be erased as a block and written or programmed on a bit, word, or page basis. The ability to erase a sector of memory at one time allows the device to update (erase and program) relatively quickly.

Flash memory devices may be used for a variety of purposes. For example, flash memory devices may be used in personal computers, digital cellular phones, digital cameras, alarm clocks, and several other devices where it is desirable to store non-volatile information that can be erased and re-programmed.

Generally, flash memory devices include several memory cells, each of which is capable of storing a charge representing a bit. Each cell generally includes a source, a drain, a floating gate, a control gate, and a dielectric material interposed between the floating gate and control gate. Information is stored within the cell by accumulating and/or discharging a charge within the floating gate to change the threshold voltage of the floating gate. For example, the cell may represent a "0" or an erased state when the floating gate is charged, and a "1" or programmed state when the floating gate is discharged.

Generally, each time new information is stored in a sector of memory in a flash memory device, all cells within the sector, whether the cells are in a charged or discharged state, are erased by, for example, submitting all the cells in the sector to a voltage bias to charge all of the floating gates within the cell. After the sector has been erased, information is programmed by discharging desired cells, one at a time, within the device, creating a pattern of binary ("0" and "1") information. The charge-discharge operation can occur several thousand times in a typical flash memory device during the use of the device over several years.

During typical use of the flash memory devices over a period of time at least some bits may remain in a charged state during each write operation. This is especially true when the data stored in a sector is upgraded with only minor changes to the data. Each time a charged cell (e.g., a cell that was not discharged during a program) is exposed to an erase step, the charge within the floating gate increases. As the charge within the floating gate increases, the voltage potential difference between the control gate (which is at a positive potential during the erase process) and the floating gate (which is at a negative voltage) increases. As the voltage difference between the control gate and the floating gate increases, the dielectric material interposed between the gates becomes stressed. Specifically, as the dielectric material between the floating and control gates is exposed to increasing bias between the two gates, current leakage and dielectric breakdown across the dielectric material becomes increasingly likely. Current leakage, dielectric material breakdown, or a combination thereof allows charges within the floating gate to dissipate. Thus, the storage retention properties of the memory device degrade with current leakage and dielectric material breakdown. Accordingly, a method which mitigates the likelihood of current leakage, dielectric material breakdown, or a combination thereof and a device for implementing such method are desired.

To reduce current leakage and dielectric breakdown, the dielectric thickness may be increased between the floating gate and control gate. However, increasing the dielectric thickness causes manufacturing problems. In particular, as the dielectric thickness increases, the material becomes increasingly difficult to etch to form a desired pattern. In addition, increasing the dielectric material thickness increases the voltage bias required to operate the flash memory device. Increasing the required voltage bias increases the power requirements to operate the flash memory device and reduces the ability to perform continued miniaturization of the memory devices. Such increase in power requirement is undesirable, particularly when the flash memory device is used in portable electronic equipment. Accordingly, an improved device to reduce stress across a dielectric material between a floating gate and a control gate of a flash memory cell that does not require increased dielectric material thickness is desired.

SUMMARY OF THE INVENTION

The present invention provides an improved apparatus and method for programming and erasing flash memory devices. More particularly, the present invention provides a method of pre-conditioning the memory devices to reduce stresses within the devices.

The way in which the present invention addresses the drawbacks of the now-known methods of programming and erasing flash memory devices is discussed in greater detail below. However, in general, the invention includes exposing flash memory cells to a pre-conditioning step prior to erasing the cell. Exposing the cell to a pre-conditioning step mitigates voltage bias buildup between a floating gate and a control gate of the flash memory cell, and thus reduces undesired stresses resulting therefrom.

In accordance with an exemplary embodiment of the present invention, the pre-conditioning step includes exposing the cells to a program or discharge operation. In accordance with an exemplary aspect of this embodiment, an entire sector of flash memory cells are preconditioned at one time. In accordance with a further aspect of this embodiment of the present invention, the pre-conditioning step is performed immediately prior to the erase operation.

In accordance with another exemplary embodiment of the present invention, a device for performing the pre-conditioning step is provided. The device is configured to at least partially discharge all of the flash memory cells within a sector at one time. In accordance with an exemplary aspect of this embodiment, the device operates in embedded mode and does not require external high voltage supplies or other control signals to perform the pre-conditioning step. In accordance with a further aspect of this embodiment, the device supplies a single pulse of current to a sector of flash memory cells.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

DETAILED DESCRIPTION OF EXEMPLARY EMBODIMENTS

The present invention generally relates to a flash memory device. More particularly, the present invention relates to a flash memory device configured to mitigate effects of voltage stress buildup, which results from erasing information from the device. For convenience, the present invention is described below in connection with F-N/F-N type flash memory devices. However, the present invention may suitably be used in connection with other types of flash memory devices such as DINOR type devices.

Figure 1:
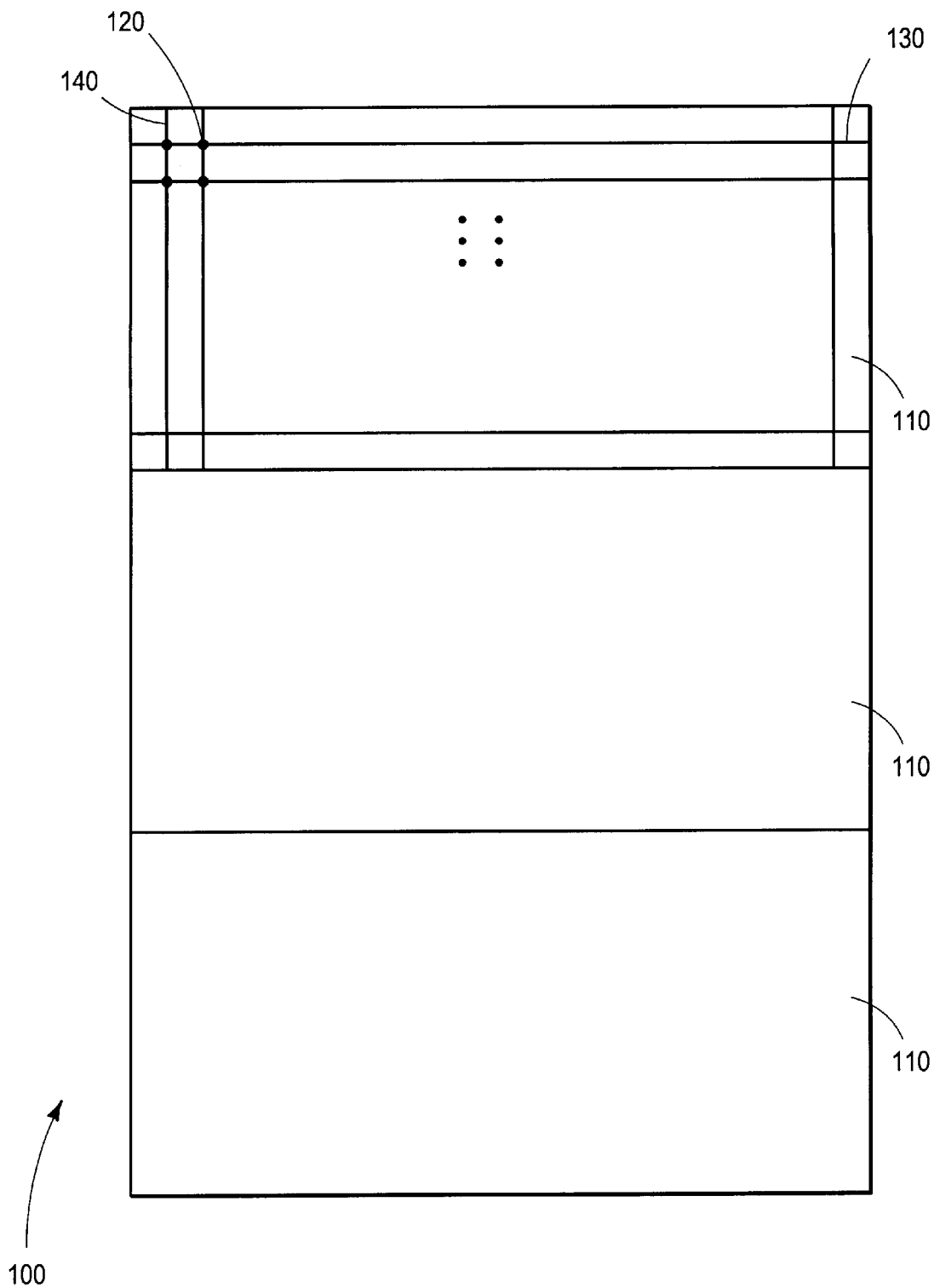
FIG. 1 is a schematic illustration of a flash memory array in accordance with the present invention.

FIG. 1 illustrates a memory array 100, including a plurality of sectors or blocks 110. Each sector 110 includes a plurality of flash memory cells 120, which are suitably located at intersections of word lines 130 and bit lines 140. Array 100 is generally configured such that each sector 110 is isolated from other sectors 110 and such that each sector 110 may be erased at one time (i.e., in a "flash"). Array 100 is generally further configured such that cells 120 are programmed on a per bit (e.g., cell 120) or a per page (one or more cells 120 along word line 130) basis. Although a page could include any number of bits along a word line, in accordance with an exemplary embodiment of the present invention, a page typically includes up to about 512 bits.

In accordance with an exemplary embodiment of the present invention, array 100 includes about 64 word lines 130 and about 1000 bit lines 140. However, the number of word lines and the number of bit lines within array 100 may vary from application to application.

Figure 2:
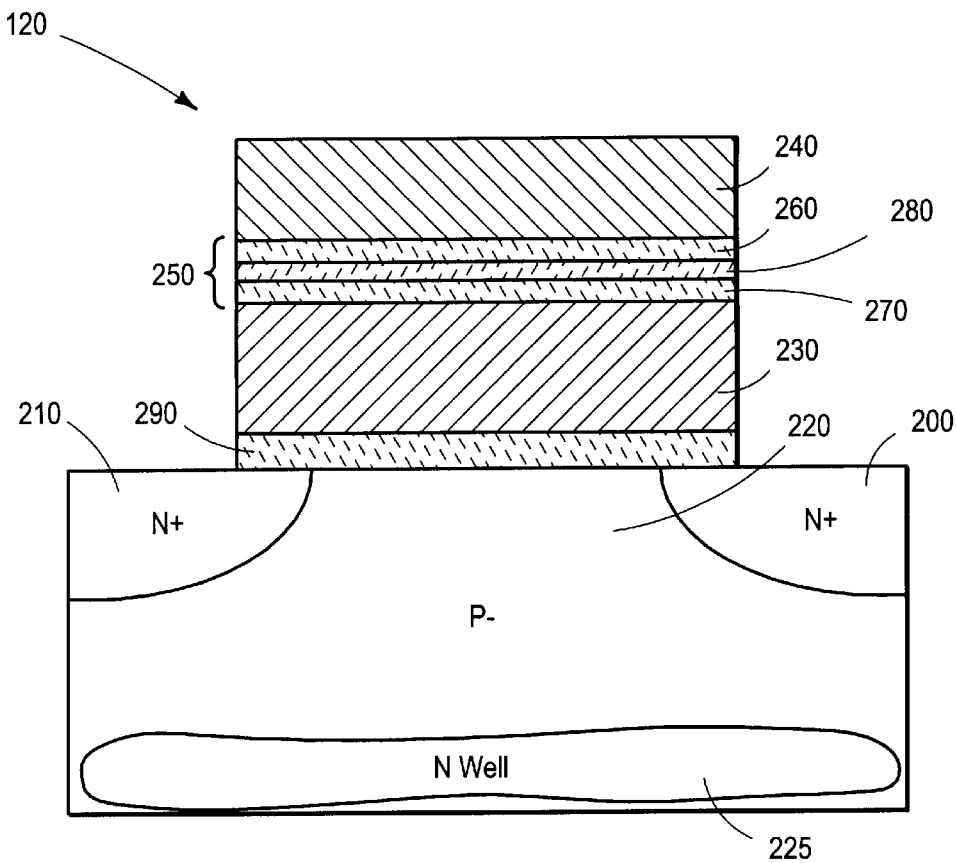
FIG. 2 is an illustration of a flash memory cell in accordance with the present invention.

FIG. 2 illustrates an exemplary flash memory cell 120 in greater detail. Memory cell 120 generally includes a source region 200, a drain region 210, a P– well 220, a deep N well 225, a floating gate electrode 230, and a control gate electrode 240. Cell 120 also includes an ONO layer 250, including oxide layers 260 and 270 and a nitride layer 280 interposed therebetween, and a tunneling oxide layer 290. In addition, although not shown in FIG. 2, cell 120 is suitably configured such that P– well 220 is completely isolated—e.g., by surrounding P– well 220 with N+, N–, or other suitably doped or insulating materials.

In accordance with an exemplary embodiment of the present invention, all control gates 240 within sector 110 along word line 130 are electrically coupled ("tied") together, and all drains 210 within sector 110 along bit line 140 are tied together. In addition, all source regions 200 for each cell 120 within sector 110 are tied together, and all P– wells within sector 110 are tied together.

In operation, information is stored in array 100 by setting cells 120 within array 100 to a charged ("0") or discharged ("1") state. Cell 120 is charged by injecting electrons into floating gate 230 and is discharged by discharging or extracting electrons from floating gate 230. As discussed in greater detail below, injecting and discharging electrons from gate 230 changes the voltage of gate 230. For example, the bias which must be applied to control gate 240 to draw current from source 200 to drain 210 ("threshold voltage") increases as gate 230 is charged with electrons. Typically, the threshold voltage of cell 120 changes from about 1 volt in a discharged state to about 5 volts in a charged state.

In accordance with an exemplary embodiment of the present invention, electrons are injected into and discharged from floating gate 230 via Fowler-Nordheim (F-N) tunneling. In particular, to inject electrons into and thus charge floating gate 230, electrons are forced to migrate from source 210 and P– well 220 and tunnel through oxide 290 to floating gate 230. In accordance with an exemplary embodiment of the present invention, electrons are caused to flow from P– well 220 and source 200 to floating gate 230 by applying about 8 to 10 volts to control gate 240, about –8 volts to P– well 220, and about –8 volts to source 200. Similarly, electrons are drained or discharged from floating gate 230 by causing electrons to migrate from floating gate 230 to drain region 210 by tunneling through oxide 290. Such migration may be effected by, for example, applying about –8 to –10 volts to control gate 240 and about 4 to 5 volts to drain region 210.

Figure 3:
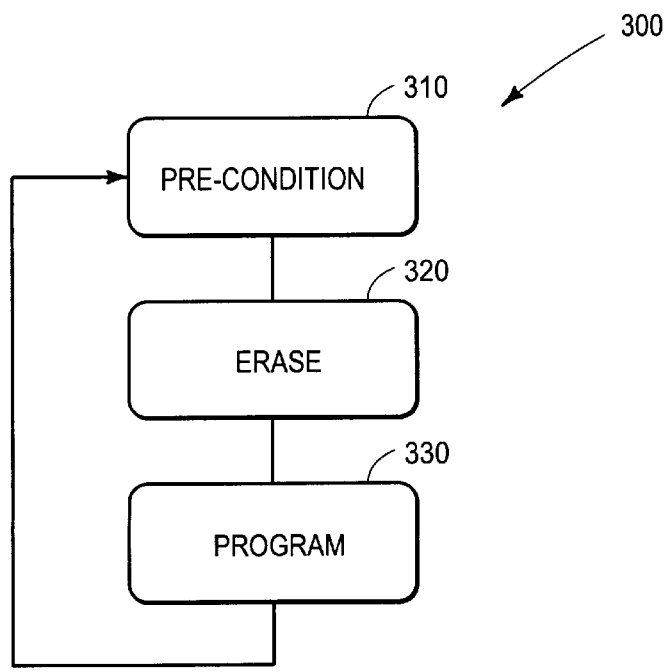
FIG. 3 is a schematic illustration of a process for programming information into the array illustrated in FIG. 1.

In accordance with an exemplary embodiment of the present invention, information is programmed into each sector 110 of array 100 according to a process 300, which is illustrated in FIG. 3. Process 300 generally includes a pre-condition step 310, an erase step 320 and a program step 330. Although process 300 is illustrated with only one pre-condition, erase, and program step, process 300 may suitably include any desired number of pre-condition 310, program 320, and erase 330 steps as indicated by the loop shown in FIG. 3.

As illustrated, process 300 begins with pre-condition step 310. Pre-conditioning step 310 is configured to mitigate effects of charge build up due to erasing already charged cells 120. In particular, in accordance with an exemplary embodiment of the present invention, preconditioning step 310 generally includes a relatively short write or discharge step prior to erase step 320 to mitigate over-erase stress in ONO layer 250.

In accordance with an exemplary embodiment of the present invention, all cells 120 within sector 110 are submitted to pre-conditioning write step 310 at substantially the same time for substantially the same amount of time. In accordance with one aspect of this embodiment, all bit lines are selected and tied to a power supply (e.g, a 2–4 volt power supply) rather than a charge pump and all word lines are tied to a charge pump having an output of about –8 to –10 volts. Tying bit lines 140 directly to a power supply rather than a charge pump allows relatively high current draw from the power supply during pre-conditioning step 310.

During pre-conditioning step 310, cells 120 need not be completely discharged. Completely discharging a charged cell 120 may take several hundred milliseconds. In accordance with an exemplary embodiment of the present invention, cells 120 are preferably discharged for an amount such that cells 120 that were previously charged and cells 120 that were previously discharged become charged to approximately the same threshold voltage during a subsequent erase step. In accordance with one aspect of this embodiment, cells 120 within sector 110, are discharge for about 10 to 20 milliseconds.

During erase step 320, all cells 120 within a sector are erased, setting cells 120 within the sector to their charged state. After all cells 120 within sector 110 have been charged, a desired binary pattern, representing information to be stored, is programmed or written to sector 110 during step 330, by discharging specific cells 120 within sector 110. Thus, cells 120 that are to remain at the charged, "0" state are not affected during the write process. When new information is to be programmed into cells 120, cells 120 are submitted to pre-condition step 310 prior to erasing (step 320) and programming (step 330) cells 120.

In accordance with an exemplary embodiment of the present invention, step 320 is configured to erase all cells 120 within sector 110 at substantially the same time. To erase sector 110, all word lines within sector 110 are selected by applying a positive voltage (e.g., about 8 to 10 volts to the control gate), a negative voltage to all P– wells 220, which are tied to each other, (e.g., about –8 volts), and a negative voltage to all source region 200 (e.g., by tying source regions 200 to P– wells 220).

Prior to erase step 320, cells 120 may be charged or discharged in a pattern representing binary information stored in sector 110. During erase step 320, all cells 120 within sector 110 are submitted to the erase or charging process. Thus, cells 120 at a written or "1" as well as cells 120 at a charged or "0" state are subjected to the erase process. As noted above, submitting already charged cells 120 to an erase process may deleteriously affect memory array 100 performance. In particular, erasing charged cell 120 increases the threshold voltage of floating gate 230. As the threshold voltage of floating gate 230 increases, the charge build up in floating gate 230 also increases, thus floating gate 230 develops a negative potential. As floating gate 230 develops an increasing negative potential, the potential difference between floating gate 230 and control gate 240 increases. Consequently, the stress across ONO layer 250 increases, and layer 250 breakdown and current leakage across layer 250 becomes increasingly likely. However, use of pre-condition step 310, described above, mitigates stress buildup during erase step 320.

Information is stored within sector 110 during program step 330 by discharging a portion of cells 120 within sector 110. Cells 120 that are to be discharged during program step 330 are selected by suitably selecting a word line 130 (e.g., by applying a negative voltage to control gates along line 130) and selecting a bit line (e.g., by applying a positive voltage to drains 210 tied together along bit line 140).

Program step 330 demands a relatively high voltage. Accordingly, during program step 330, charge pumps are often used to convert relatively low voltage (e.g., 2–4 volts) to higher voltage (e.g., 5–10 volts). The charge pumps generally have a limited current supply, so only one cell or one page (containing up to about 512 bits) can be written to at one time.

Figure 4:
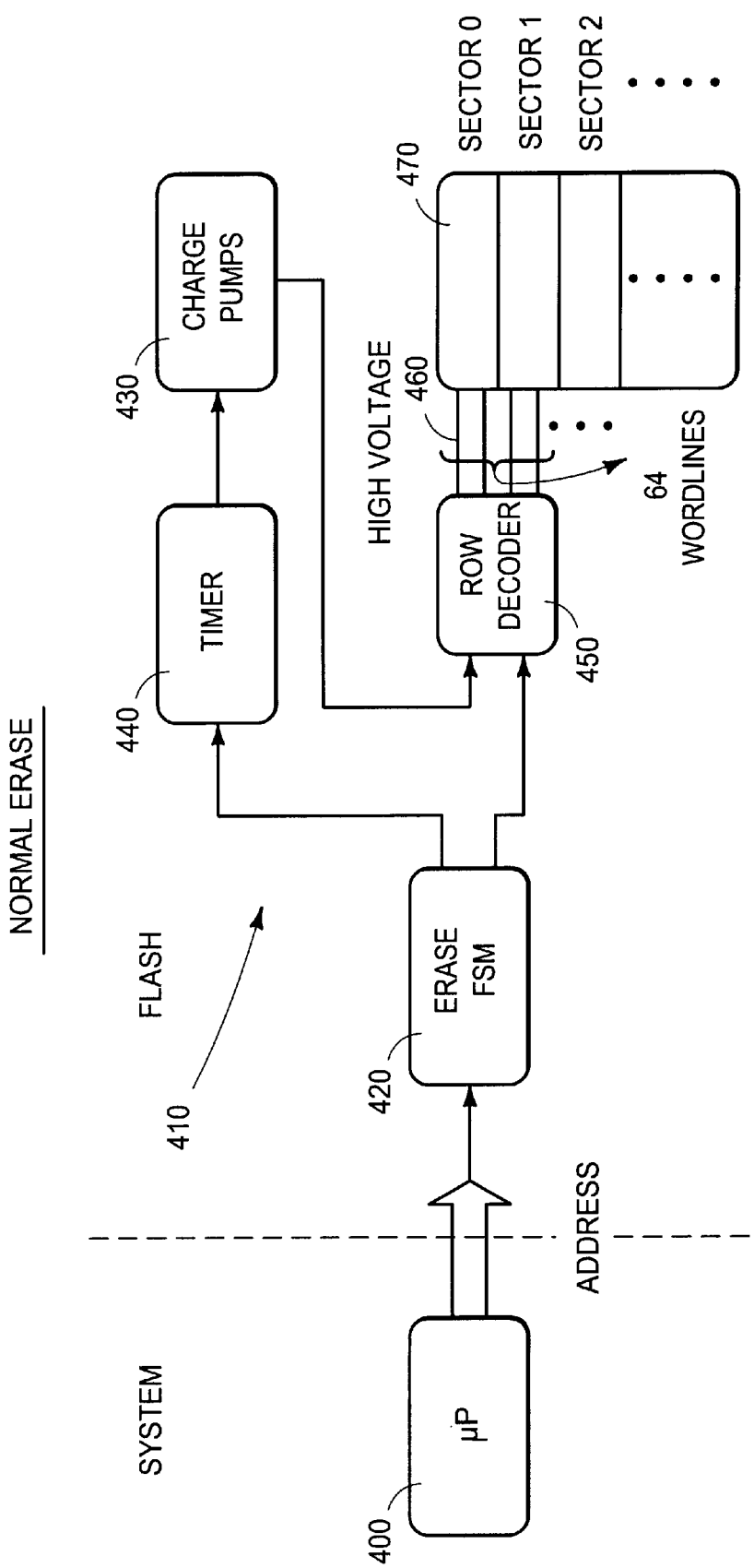
FIG. 4 is a schematic illustration of an erase process known in the art.

A schematic diagram of a typical embedded erase operation is illustrated in FIG. 4. During the erase operation an external system (e.g. a microprocessor 400) issues an erase command to a flash memory device 410 with a sector address. The erase command will then enable or turn on an erase finite state machine (FSM) 420 within flash memory 410. Erase FSM 420 will then activate charge pumps 430 and a timer 440 configured to control the duration of the erase operation. Outputs from charge pumps 430 and erase FSM 420 are coupled to a row decoder 450 to enable all word lines 460 within a sector 470 to be coupled to high voltage output from charge pumps 430 for a predetermined amount of time set by timer 440. When the erase operation is complete, FSM 420 performs a verify operation.

Figure 5:
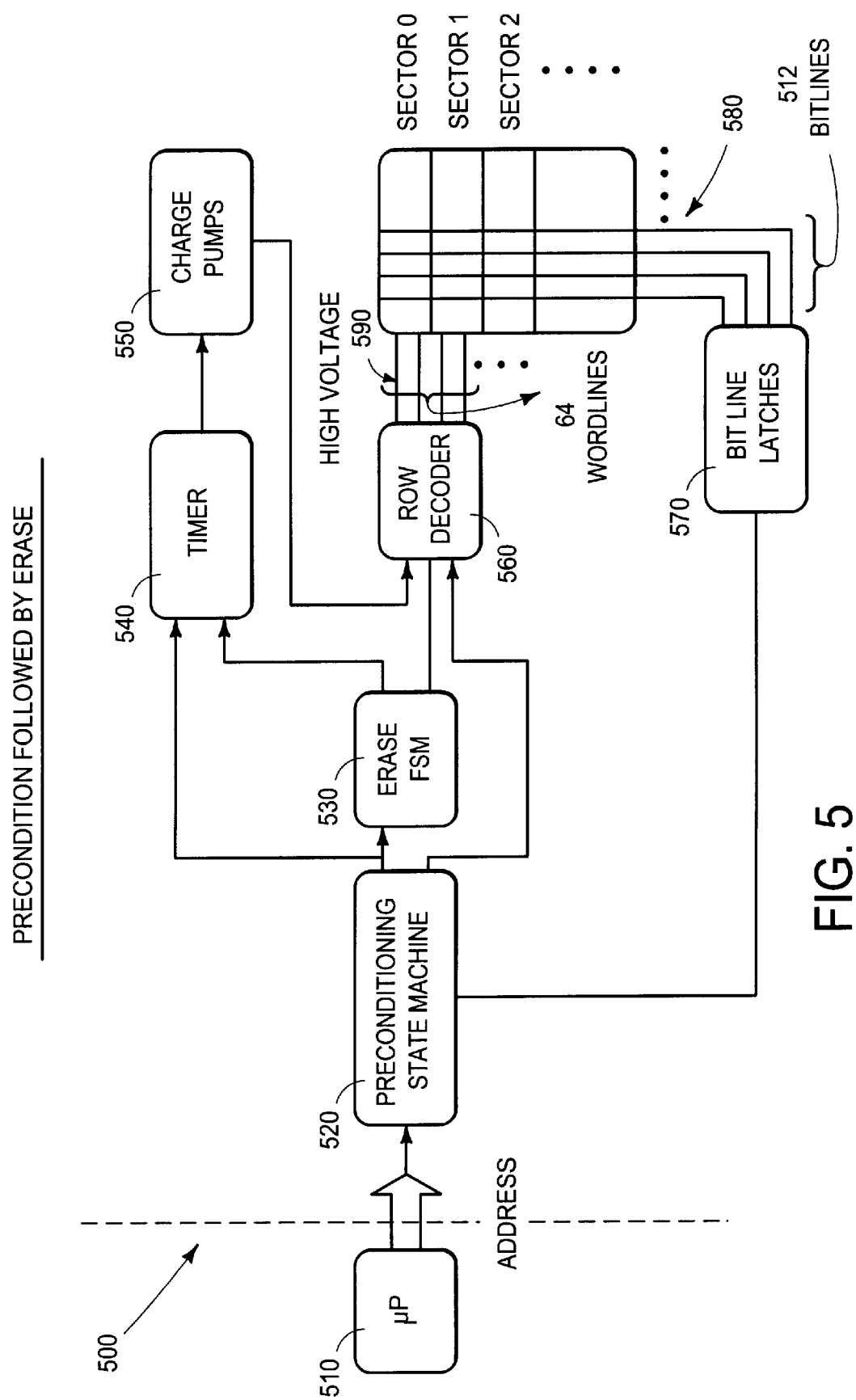
FIG. 5 a schematic illustration of a pre-conditioning process in accordance with an exemplary embodiment of the present invention.

In accordance with the present invention, a flash memory pre-condition step will be performed prior to performing an erase operation. FIG. 5 is a schematic illustration of a device 500 suitable for pre-conditioning and erasing flash memory devices.

Device 500 suitably includes a microprocessor 510, a pre-conditioning state machine (PSM) 520 configured to pre-condition flash memory devices in accordance with the present invention, an erase machine 530, a timer 540, charge pumps 550, a row decoder 560, and bit line latches 570.

Figure 6:
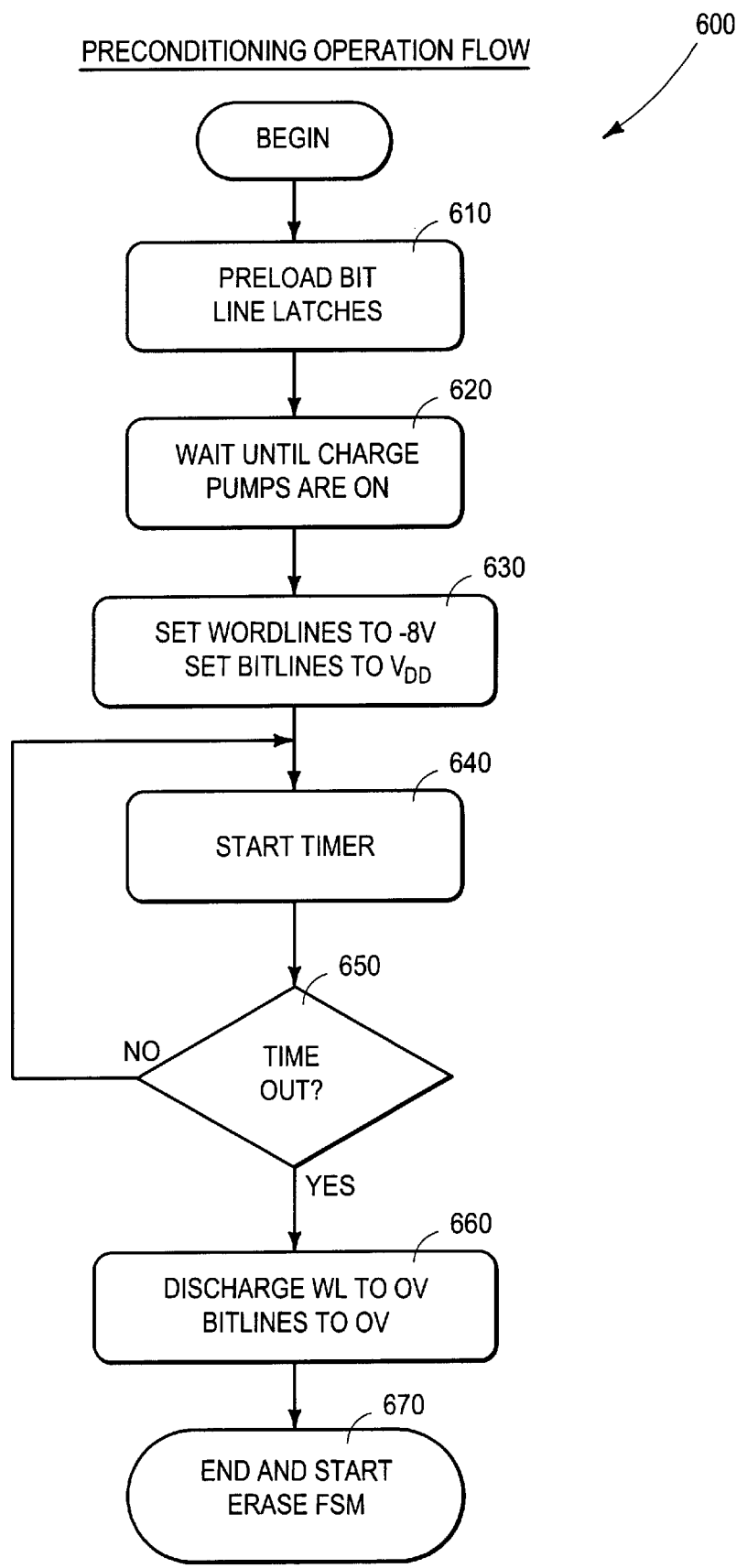
FIG. 6 is a flow diagram illustrating a pre-conditioning process in accordance with the present invention.

FIG. 6 is a flow diagram illustrating a process 600 suitable for pre-conditioning flash memory devices. As illustrated process 600 includes a preload bit line latches step 610, a wait for charge pumps to activate step 620, a set word lines and bit lines step 630, a start timer step 640, a time out step 650, a discharge step 660, and an end pre-conditioning start erase operation step 670.

In accordance with the pre-conditioning operation illustrated in FIGS. 5 and 6, an erase command from microprocessor 510 activates PSM 520. PSM 520 then pre-loads bit line latches 520 (step 610) in a manner configured to cause power (e.g., from the power supply, VDD) to be applied to bit lines 580. Next, device 500 waits for charge pumps 550 to turn on (step 620). Once charge pumps 550 are activated, voltage is applied to bit lines 580 and word lines 590 (step 630). Timer 540 is activated (step 640) as power is applied to bit lines 580 and word lines 590, such that power is supplied to word lines 590 for about 10–20 milliseconds while bit lines 580 are coupled to VDD. Process 600 illustrated in FIGS. 5 and 6 is configured to discharge all cells within a sector to a charge level, such that after a subsequent erase operation is complete, all cells within a sector will be charged to approximately the same threshold voltage. Thus, overcharging problems associated with prior art methods and devices for pre-conditioning are mitigated.

Although the present invention is set forth herein in the context of the appended drawing figures, it should be appreciated that the invention is not limited to the specific form shown. For example, while the process for programming a sector of flash memory devices is described in conjunction with an initial pre-condition step, the process may suitably include an initial write step. Various other modifications, variations, and enhancements in the design and arrangement of the method and apparatus set forth herein, may be made without departing from the spirit and scope of the present invention as set forth in the appended claims.

We claim:

1. A method of programming a flash memory device comprising sectors, each sector including bit lines and word lines, said method comprising the steps of:

selecting a sector to program;
   pre-conditioning cells within the selected sector; and
   programming cells within the selected sector;
   wherein said pre-conditioning step includes exposing substantially all of the cells within the sector to said pre-conditioning step at about the same time.

2. A method of programming a flash memory device comprising sectors, each sector including bit lines and word lines, said method comprising the steps of selecting a sector to program;
   pre-conditioning cells within the selected sector; and
   programming cells within the selected sector;

wherein said pre-conditioning step includes applying about 2 to about 4 volts to the bit lines and about −8 volts to −10 volts to the word lines.

3. The method according to claim 1, wherein said pre-conditioning step includes at least partially discharging the cells within the sector.

4. The method according to claim 1, further comprising a step of erasing said cells.

5. The method according to claim 1, wherein said pre-conditioning step includes performing at least a partial write operation.

6. The method according to claim 1, wherein said pre-conditioning step is performed for about 10 milliseconds to about 20 milliseconds.

7. The method according to claim 1, wherein said selecting step includes selecting a sector of a FN-FN type flash memory device.

8. The method according to claim 1, wherein said pre-conditioning step includes:

preloading bit line latches;

waiting for charge pumps to activate;

setting word lines;

setting bit lines; and starting a timer.

9. The method according to claim 2, further comprising a step of erasing said cells.

10. The method according to claim 2, wherein said pre-conditioning step includes at least partially discharging a portion of said cells.

11. The method according to claim 2, wherein said pre-conditioning step includes performing at least a partial write step to at least a partial write step to at least some of the cells.

12. The method according to claim 2, wherein said pre-conditioning step includes:

preloading bit line latches;

waiting for charge pumps to activate;

setting word lines;

setting bit lines; and starting a timer.

* * * * *